(12) United States Patent
Ghanbari

(10) Patent No.: US 11,673,230 B2
(45) Date of Patent: Jun. 13, 2023

(54) METHOD AND APPARATUS FOR REMOVING A CONFORMAL COATING FROM A CIRCUIT BOARD

(71) Applicant: HZO, Inc., Morrisville, NC (US)

(72) Inventor: Ebrahim Ghanbari, London (GB)

( * ) Notice: Subject to any disclaimer, the term of this patent is extended or adjusted under 35 U.S.C. 154(b) by 278 days.

(21) Appl. No.: 16/772,371

(22) PCT Filed: Dec. 3, 2018

(86) PCT No.: PCT/GB2018/053495
§ 371 (c)(1),
(2) Date: Jun. 12, 2020

(87) PCT Pub. No.: WO2019/122810
PCT Pub. Date: Jun. 27, 2019

(65) Prior Publication Data
US 2021/0078136 A1 Mar. 18, 2021

(30) Foreign Application Priority Data
Dec. 18, 2017 (GB) ...................... 1721176

(51) Int. Cl.
| | | |
|---|---|---|
| B24C 1/00 | (2006.01) | |
| B24C 1/08 | (2006.01) | |
| B24C 3/32 | (2006.01) | |
| H05K 3/22 | (2006.01) | |

(52) U.S. Cl.
CPC .............. *B24C 1/003* (2013.01); *B24C 1/086* (2013.01); *B24C 3/322* (2013.01); *H05K 3/22* (2013.01)

(58) Field of Classification Search
CPC ......... B24C 1/003; B24C 1/086; B24C 3/322; H05K 3/22
See application file for complete search history.

(56) References Cited

U.S. PATENT DOCUMENTS

| | | | | |
|---|---|---|---|---|
| 5,372,652 A | * | 12/1994 | Srikrishnan | ....... H01L 21/67028 134/21 |
| 5,390,450 A | * | 2/1995 | Goenka | .................... B24C 1/003 451/39 |
| 5,405,283 A | * | 4/1995 | Goenka | ................. B24C 7/0084 451/39 |
| 5,514,024 A | * | 5/1996 | Goenka | ..................... B24C 5/04 451/39 |
| 5,545,073 A | * | 8/1996 | Kneisel | .................... B05B 1/005 451/39 |
| 5,616,067 A | * | 4/1997 | Goenka | ..................... B24C 5/04 451/39 |
| 5,928,434 A | * | 7/1999 | Goenka | ................. B08B 7/0092 451/75 |
| 6,103,016 A | * | 8/2000 | Jon | ......................... B24C 1/003 134/28 |
| 6,343,609 B1 | * | 2/2002 | Kim | .................. H01L 21/67051 134/1 |
| 2006/0011734 A1 | * | 1/2006 | Kipp | ..................... B24C 7/0046 239/11 |

(Continued)

*Primary Examiner* — Sharidan Carrillo
(74) *Attorney, Agent, or Firm* — Intellectual Strategies

(57) ABSTRACT

A method of removing a conformal coating from a circuit board coated with said conformal coating, the method comprising: subjecting the circuit board to a jet comprising dry-ice ejected from a nozzle, to remove said conformal coating from said circuit board.

13 Claims, 4 Drawing Sheets

(56) References Cited

U.S. PATENT DOCUMENTS

| | | | |
|---|---|---|---|
| 2008/0213978 A1* | 9/2008 | Henry | B23K 26/40 |
| | | | 257/E21.238 |
| 2016/0008837 A1* | 1/2016 | Richard | B24C 1/003 |
| | | | 134/34 |
| 2016/0008923 A1* | 1/2016 | Astle | H01L 21/561 |
| | | | 427/555 |
| 2016/0184964 A1* | 6/2016 | Popeck | B24C 1/003 |
| | | | 451/75 |
| 2021/0078136 A1* | 3/2021 | Ghanbari | B24C 1/086 |

* cited by examiner

METHOD AND APPARATUS FOR REMOVING A CONFORMAL COATING FROM A CIRCUIT BOARD

CROSS-REFERENCE TO RELATED APPLICATIONS

This application is a U.S. National Phase Application of PCT International Application No. PCT/GB2018/053495, filed Dec. 3, 2018, which is an International Application of and claims the benefit of priority to British Patent Application No. 1721176.4, filed on Dec. 18, 2017, the entire contents of which are herein incorporated by reference.

FIELD OF THE INVENTION

The present invention relates to removing a conformal coating from a circuit board. In particular, the invention relates to removing a conformal coating formed by plasma deposition.

BACKGROUND

Plasma deposition is a known method for providing conformal coatings to substrates, such as electronics. Plasma deposition apparatuses generally comprise a process chamber and a plasma source for providing a plasma within the process chamber. A substrate, i.e. an electrical assembly such as a printed circuit board (PCB), is placed within the chamber, interacts with the plasma and thus is processed. In the case of plasma deposition, a coating of material formed from the plasma is deposited on the substrate.

A conformal coating is a protective coating or film that 'conforms' to the circuit board topology. Conformal coatings may protect circuit boards from moisture and/or chemical contaminants. Conformal coatings may provide electrical insulation that ensures the operational integrity of the circuit board. Conformal coatings may provide a barrier to airborne contaminants from the operating environment, such as salt-spray, thus preventing corrosion.

Sometimes a circuit board may need to be repaired or refurbished. In order to repair or refurbish a circuit board coated with a conformal coating, at least part of the conformal coating might need to be removed. Known methods for removing conformal coatings include using solvents to dissolve the coating, mechanically scraping the coating from the circuit board, and plasma processing. Each of these methods has limitations. Plasma processing is expensive, the use of solvents can damage circuits, as can mechanically removing the coating. There is a need to provide a method for removing conformal coatings which is inexpensive, reliable and minimises damage to the circuit board.

It is an aim of the present invention to at least partially address some of the problems discussed above.

SUMMARY OF THE INVENTION

Accordingly, there is provided a method of removing a conformal coating from a circuit board coated with said conformal coating, the method comprising: subjecting the circuit board to a jet comprising dry-ice ejected from a nozzle, to remove said conformal coating from said circuit board. This provides a more inexpensive and reliable way of removing a conformal coating, without damaging the circuit board.

Optionally, the dry-ice comprises particles having a mean diameter of from 200 microns to 600 microns.

Optionally, the jet additionally comprises air ejected from the nozzle. Preferably, the air from the nozzle is ejected at a flow rate of from 1 to 2 m$^3$/minute. Preferably, air to be ejected from the nozzle is fed into the nozzle at a pressure of from 3 to 4 bar.

Optionally, the nozzle comprises an output orifice through which the jet is ejected, wherein the output orifice is substantially circular in shape. Preferably, the output orifice has a diameter of less than 1 mm. More preferably, the output orifice has a diameter of less than 0.5 mm Optionally, the nozzle comprises an output orifice through which the jet is ejected, wherein the output orifice is substantially rectangular in shape. Preferably, the smallest dimension of the output orifice is less than 1 mm. Preferably, the smallest dimension of the output orifice is less than 0.5 mm.

Optionally, the nozzle comprises an elongate shaft, the output orifice being provided at a distal end of said shaft, wherein a direction normal to the output orifice forms an angle with an axis parallel to the elongate shaft of from 45 degrees to 60 degrees.

Optionally, a distal end of the nozzle is tapered.

Optionally the nozzle is positioned relative to the circuit board such that an axis parallel to an elongate shaft of the nozzle forms an angle with an axis normal to the circuit board of between 45 degrees and 60 degrees.

Optionally, the nozzle is positioned relative to the circuit board such that a distal end of the nozzle is at least 5 cm from the surface of the circuit board.

Optionally, the nozzle comprises a structure configured to reduce the size of the dry ice particles.

Optionally, the nozzle is configured to increase the air pressure within the nozzle from a proximal end to a distal end thereof. Alternatively, the nozzle is configured to reduce the air pressure within the nozzle from a proximal end to a distal end thereof.

There is also provided a nozzle for use in the method above, the nozzle comprising: an elongate shaft having a proximal end and a distal end; an input orifice at the proximal end; an output orifice at the distal end; and a structure, located between the input orifice and the output orifice, configured to reduce the size of the dry ice particles entering the nozzle via the input orifice.

BRIEF DESCRIPTION OF THE DRAWINGS

Optionally, the nozzle is configured to increase the air pressure within the nozzle from the proximal end to the distal end. Alternatively, the nozzle is configured to reduce the air pressure within the nozzle from the proximal end to the distal end.

Further features of the invention are described below by way of non-limiting example and with reference to the accompanying drawings in which.

DETAILED DESCRIPTION OF THE INVENTION

The invention provides a method of removing a conformal coating from a circuit board coated with said conformal coating. The conformal coating may comprise, for example, coatings (such as those disclosed in WO 2008/102113, WO 2010/020753 and WO 2012/066273, the contents of which are hereby incorporated by reference) obtainable by plasma deposition of one or more halohydrocarbon precursor compounds (particularly fluorohydrocarbons such as hexafluoropropylene);

coatings (such as those disclosed in WO 2011/104500, the contents of which are hereby incorporated by reference) obtainable by plasma deposition of one or more aromatic organic precursor compounds such as alkyl-substituted benzene compounds (particularly dimethyl benzenes, for example 1,4-dimethyl benzene, also known as para-xylene);

coatings (such as those disclosed in WO 2016/198870, WO 2017/029477 and WO 2017/085482, the contents of which are hereby incorporated by reference) obtainable by plasma deposition of one or more organosilicon compounds (particularly hexamethyldisiloxane); or mixtures of any of the above coatings (such as the multilayer coatings disclosed in WO 2013/132250, WO 2014/155099 and WO 2017/125741 the contents of which are hereby incorporated by reference).

The circuit board may be a printed circuit board (PCB). A PCB mechanically supports and electrically connects electronic components using conductive tracks, pads and other features, typically etched from copper sheets laminated onto a non-conductive substrate. Components (e.g. capacitors, resistors or active devices) are generally soldered on the PCB. PCBs may contain components embedded in the substrate.

The method of the invention comprises subjecting the circuit board to a jet comprising dry-ice ejected from a nozzle, to remove said conformal coating from said circuit board. Typically, dry ice-blasting is used for heavy duty cleaning, not for cleaning delicate items such as circuit boards. However, the inventors have realised that, if properly administered, dry ice can provide a reliable way of removing conformal coatings from circuit boards.

Figure 1:
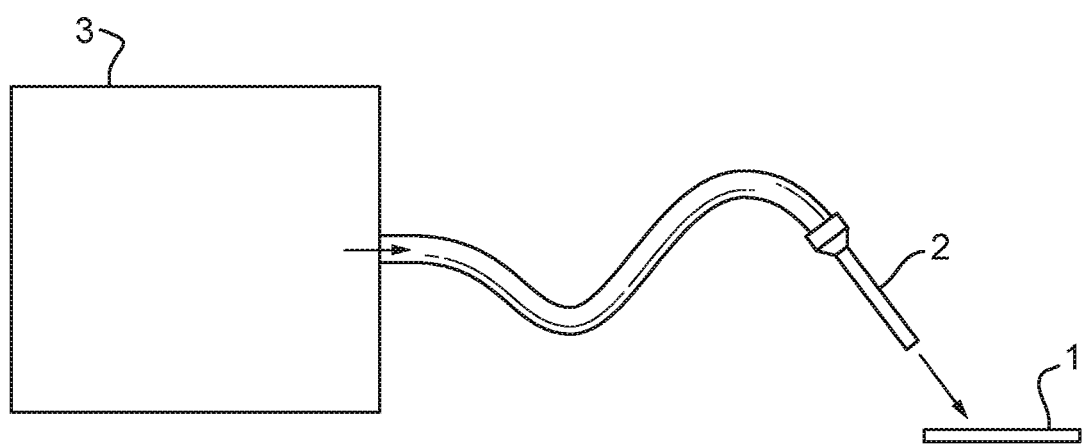
FIG. 1 shows a set-up for removing a conformal coating.

FIG. 1 shows an example set-up apparatus used for removing a conformal coating from a circuit board 1. As shown, the set up comprises a dry ice blasting system 3 connected to a nozzle 2. The nozzle is used to direct a jet comprising dry ice towards the circuit board 1.

The dry ice blasting system may be a commercially available system such as the Cold Jet® i3 MicroClean. Such systems commonly allow the user to vary parameters including dry ice feed rate, airflow rate (air consumption) and blast air pressure. For example, the i3 MicroClean system provides a dry ice feed rate from 0 to 0.6 kg per minute, an air flow rate of between 0.85 to 1.4 m$^3$/minute at 80PSI (5.5 bar, for standard nozzles) and a blast air pressure from 0 to 9.7 bar.

The dry ice blasting system 3 produces a jet of pressurised air which additionally comprises particles of dry ice. The dry ice particles typically have a mean diameter of from 200 microns to 600 microns. Preferably, the dry ice particles for use in removing a conformal coating 4 (from a circuit board) have a mean diameter of from 250 microns to 300 microns.

Preferably the jet of pressurised air is ejected from the nozzle 2 at a rate of from 1.2 m$^3$/minute. Further, the air to be ejected from the nozzle may be fed into the nozzle 2 at a pressure of from 3 to 4 bar. These parameters reduce the possibility of damage occurring to the circuit board 1, whilst still effectively removing the conformal coating 4.

Figure 2:
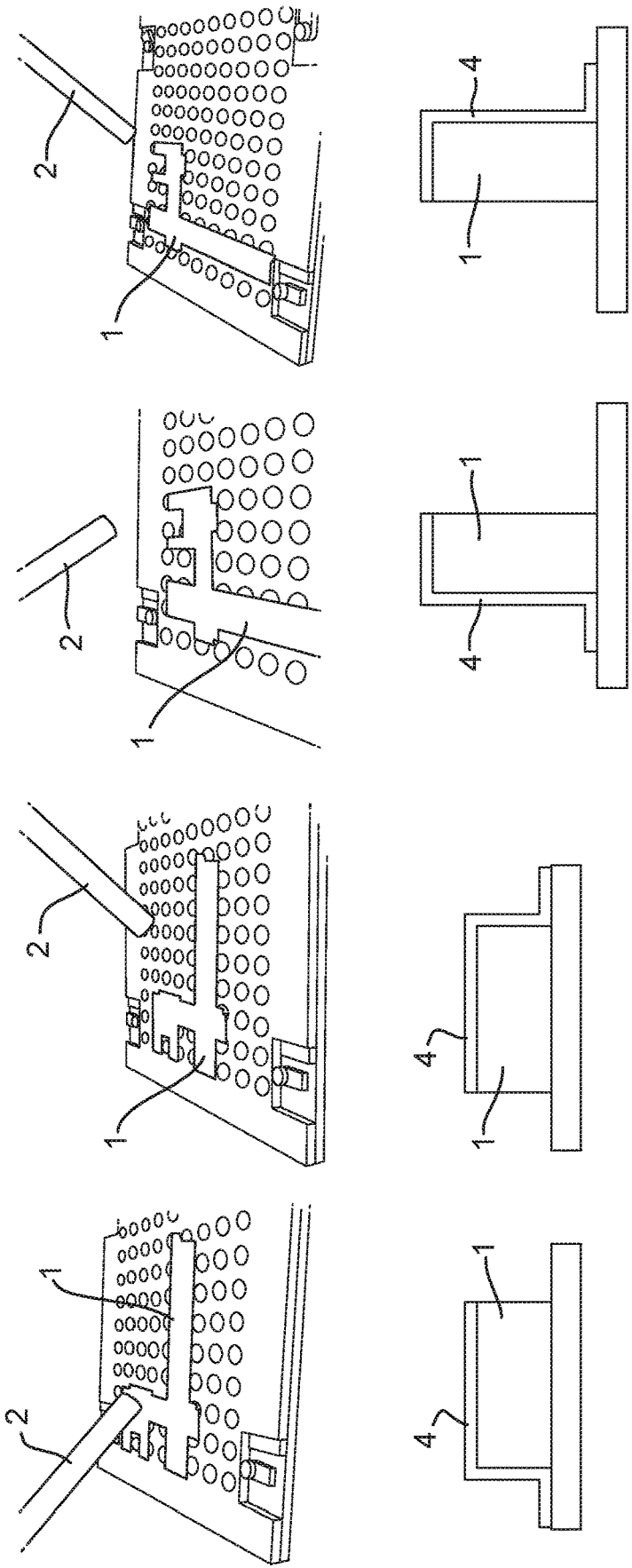
FIG. 2 shows a steps of an example method of removing a conformal coating.

FIG. 2 shows an example method of removing a conformal coating 4 from a circuit board 1. The nozzle 2 is directed towards the circuit board 1 at an angle of between 45 degrees and 60 degrees to an axis normal to the circuit board 1 and/or the surface on which the circuit board 1 is placed. The nozzle 2 and the circuit board 1 are systematically rotated relative to each other, as shown in FIG. 2, so as to remove all of the coating 4 effectively. Also as shown in FIG. 2, the nozzle 2 is preferably positioned relative to the circuit board 1 such that a distal end of the nozzle 2 is at least 5 cm from the surface of the circuit board 1. This distance reduces the chance of damaging the circuit board 1 while still effectively removing the conformal coating 4.

Figure 3:
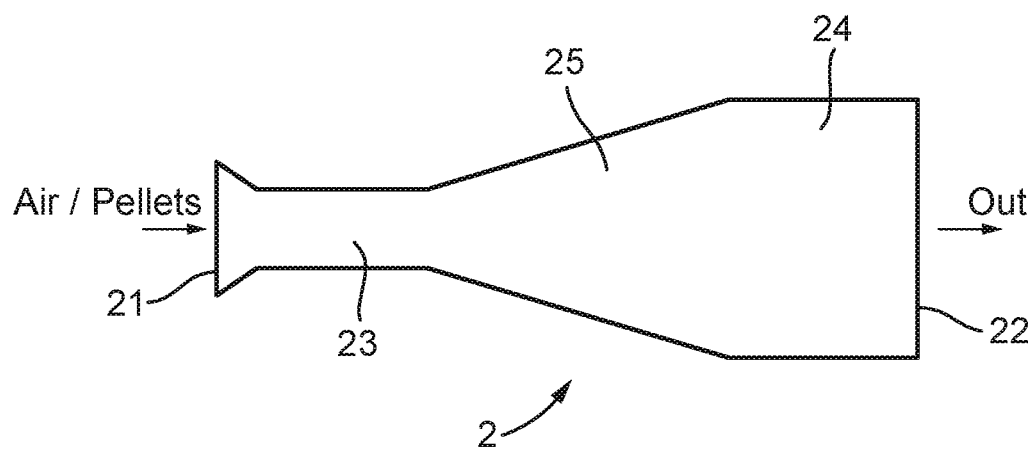
FIGS. 3 to 6 respectively show examples of different nozzles.

FIG. 3 shows a first example of a nozzle 2 to be used for the removing the conformal coating 4 from a circuit board 1. The nozzle 2 generally comprises an elongate shat in the form of a hollow tube. The nozzle 2 comprises an input orifice 21 at a proximal end thereof and an output orifice 22 at a distal end thereof. Pressurised air and dry ice particles from a dry ice blasting system 3 enter the nozzle 2 through the input orifice 21 and exit the nozzle 2 from the output orifice 22, to subject the circuit board 1 to the dry ice jet. The nozzle 2 shown in FIG. 3 comprises a relatively narrow portion 23 at the proximal end of the nozzle 2, a relatively wide portion 24 at the distal end of the nozzle 2 and a tapered portion 25 between the narrow portion 23 and the wide portion 24. The difference in cross-sectional area between the narrow portion 23 and the wide portion 24 reduces the air pressure as the air travels from the proximal end to the distal end of the nozzle 2. This reduces the possibility of damage to the circuit board 1 as well as increasing the surface area of the dry ice jet.

Figure 4:
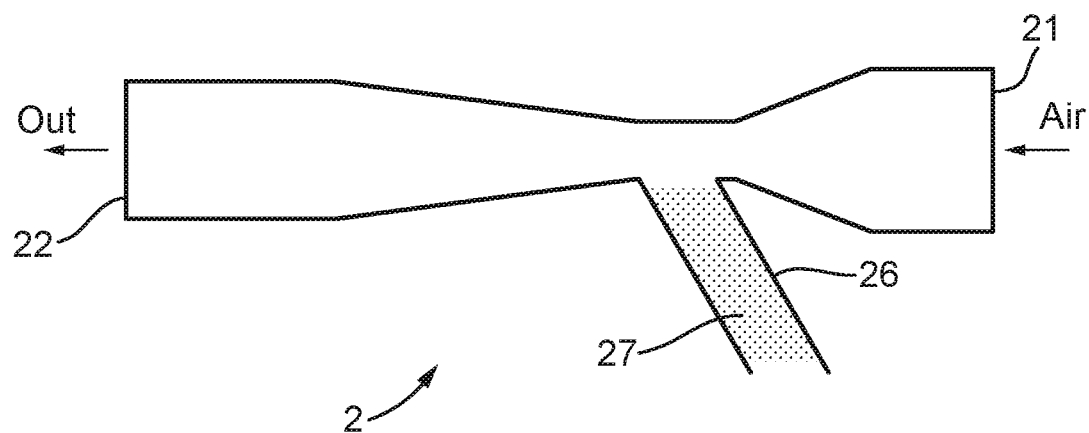

FIG. 4 shows a second example of a nozzle to be used for removing a conformal coating 4 from a circuit board 1. As shown in FIG. 4, the nozzle 2 comprises an additional input in the form of dry ice input channel 26. Pressurised air is input through the input orifice 21 and dry ice particles are input via the dry ice input channel 26. The dry ice input channel 26 inputs dry ice at a location between the input orifice 21 and the output orifice 22 of the nozzle 2. As shown in FIG. 4, the portion of the nozzle 2 at which the dry ice input channel 26 is connected may be relatively narrow compared to the distal and proximal ends of the nozzle 2. However, this is not necessarily the case. For example, the nozzle 2 may have a uniform width. As shown in FIG. 4, the dry ice input channel 26 comprises a rotating screw 27. The rotating screw 27 reduces the size of the dry ice particles as they pass through the dry ice input channel 26. Other mechanisms for reducing the size of the dry ice particles may be used instead of a screw. Creating finer dry ice particles reduces the possibility of damaging the circuit board 1 when removing the conformal coating 4.

Figure 5:
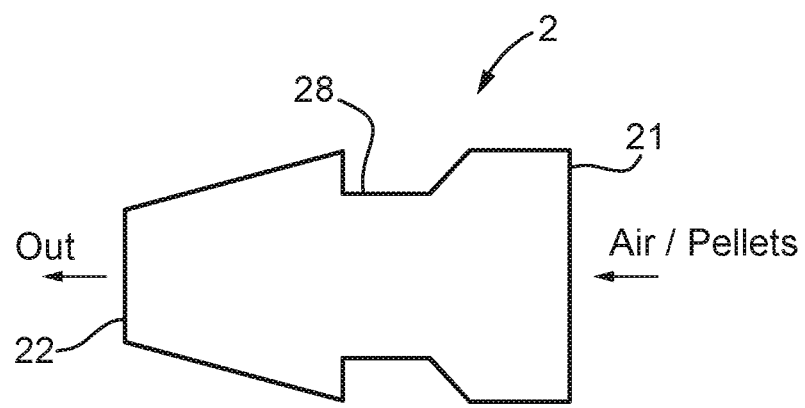

FIG. 5 shows a third example of a nozzle to be used for removing a conformal coating 4 from a circuit board 1. As shown in FIG. 5, the diameter of the nozzle 2 is smaller at the output orifice 22 than the input orifice 21. This increases the air pressure at the output orifice 22, thus more effectively removing the conformal coating 4. Further, the nozzle 2 is relatively short (e.g., 5-10 millimetres in length, whereas the other example nozzles disclosed have a length of more than 10 millimetres, e.g. 10-30 millimetres) such that the air pressure does not drop significantly from the input orifice 21 to the output orifice 22. Also as shown in FIG. 5, the nozzle 2 may comprise a relatively narrow portion between the distal and proximal ends of the nozzle 2. This is for protecting the nozzle tip from clogging due to recoiled coating materials.

Figure 6:
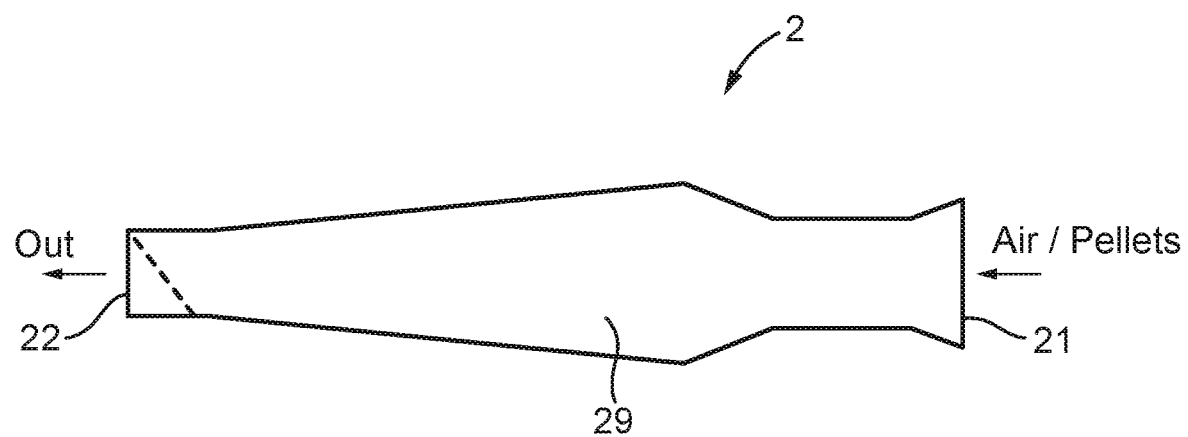

FIG. 6 shows a fourth example of a nozzle 2 to be used for removing a conformal coating 4 from a circuit board 1. The nozzle 2 comprises a relatively wide portion 29 between the distal and proximal ends of the nozzle 2. The nozzle 2 is tapered outwards from the input orifice 21 to the wider portion 29 and tapered inwards from the wider portion 29 towards the output orifice 22. The wider portion 29 provides a dry ice diffuser, which causes the dry ice particles to break down into smaller particles. Smaller particles reduce the likelihood of damage to the circuit board 1. Further, in the example shown in FIG. 6, the output orifice 22 is relatively narrow compared to the input orifice 21. This increases the air pressure at the output orifice 22 relative to the input orifice 21, thus more effectively cleaning the conformal coating 4 from the circuit board 1.

In the examples shown in FIGS. 3 to 6, the nozzles have a substantially circular cross-section. However, other cross-sections may be used. For example, the nozzles may have a rectangular cross-section.

In the case of nozzles having a circular cross-section, the output orifice 22 preferably has a diameter of less than 1 mm, and more preferably, less than 0.5 mm. In the case of a nozzle with a rectangular cross-section, it is preferable the smallest dimension of the output orifice 22 is less than 1 mm and more preferably, less than 0.5 mm.

The nozzles shown in FIGS. 3 to 6 have a flat distal end, i.e. the plane of the output orifice 22 is normal to a longitudinal axis of the nozzle 2. However, this is not necessarily the case. For example, the distal end of the nozzle 2 may be tapered, as shown by the dashed line in FIG. 6. As shown in FIG. 6, the distal end of the nozzle 2 may be effectively "cut-off" at an angle to provide the taper. This angle is preferably between 45 degrees and 60 degrees relative to the longitudinal axis of the nozzle.

Variations of the above examples are possible within the scope of the invention. For example, features of different examples described above may be combined.

The invention claimed is:

1. A method of removing a conformal coating from a circuit board coated with said conformal coating, the method comprising:
    subjecting the circuit board to a jet comprising dry-ice particles ejected from a nozzle, to remove said conformal coating from said circuit board, wherein the nozzle is positioned relative to the circuit board such that an axis parallel to an elongated shaft of the nozzle forms an angle with an axis normal to the circuit board of between 45 degrees and 60 degrees; and
    systematically rotating the jet and systematically rotating the circuit board relative to each other, wherein the jet additionally comprises air ejected from the nozzle, wherein the air from the nozzle is ejected at a flow rate of from 1 to 2 $m^3$/minute, and wherein the air ejected from the nozzle is fed into the nozzle at a pressure of from 3 to 4 bar, and wherein the method further comprises utilizing a rotating screw to reduce a size of the dry ice particles as they pass through a dry ice input channel on the nozzle.

2. The method of claim 1, wherein the dry-ice particles have a mean diameter of from 200 microns to 600 microns.

3. The method of claim 1, wherein the nozzle comprises an output orifice through which the jet is ejected, wherein the orifice is substantially circular in shape.

4. The method of claim 1, wherein the nozzle comprises an output orifice through which the jet is ejected, wherein the orifice is substantially rectangular in shape.

5. The method of claim 1 wherein a distal end of the nozzle is tapered.

6. The method of claim 1, wherein the nozzle is positioned relative to the circuit board such that a distal end of the nozzle is at least 5 cm from a surface of the circuit board.

7. The method of claim 1, wherein the nozzle is configured to increase an air pressure within the nozzle from a proximal end to a distal end thereof.

8. The method of claim 1, wherein the nozzle is configured to reduce an air pressure within the nozzle from a proximal end to a distal end thereof.

9. The method of claim 3, wherein the output orifice has a diameter of less than 1 mm.

10. The method of claim 3, wherein the output orifice has a diameter of less than 05 mm.

11. The method of claim 3, wherein the output orifice is provided at a distal end of said elongated shaft.

12. The method of claim 4, wherein a smallest dimension of the output orifice is less than 1 mm.

13. The method of claim 4, wherein a smallest dimension of the output orifice is less than 0.5 mm.

* * * * *